United States Patent [19]
Huang et al.

[11] Patent Number: 5,972,764
[45] Date of Patent: Oct. 26, 1999

[54] METHOD FOR MANUFACTURING MOS TRANSISTOR

[75] Inventors: Hsiu-Wen Huang, Kaoshiung; Jhy-Jyi Sze, Tainan, both of Taiwan

[73] Assignee: United Semiconductor Corp., Hsinchu, Taiwan

[21] Appl. No.: 09/270,026

[22] Filed: Mar. 16, 1999

[30] Foreign Application Priority Data

Dec. 14, 1998 [TW] Taiwan .................................. 87120716

[51] Int. Cl.⁶ .................................................. H01L 21/336
[52] U.S. Cl. .......................... 438/305; 438/306; 438/279; 438/595; 438/976
[58] Field of Search ..................................... 438/263, 264, 438/266, 290, 301, 303, 305, 306, 307, 275, 419, 594, 279, 595, 954, 976

[56] References Cited

U.S. PATENT DOCUMENTS

| | | | |
|---|---|---|---|
| 5,234,850 | 8/1993 | Liao | 438/305 |
| 5,595,919 | 1/1997 | Pan | 438/305 |
| 5,736,446 | 4/1998 | Wu | 438/305 |

*Primary Examiner*—Charles Bowers
*Assistant Examiner*—Jack Chen
*Attorney, Agent, or Firm*—Jiawei Huang; J.C. Patents

[57] ABSTRACT

A method for manufacturing a metal-oxide-semiconductor (MOS) transistor is described. In the invention, doped regions of the local pocket type are formed in the substrate after the source/drain terminals of a MOS transistor in the logic circuit area are formed. The method includes the steps of forming an insulation layer over the entire substrate. Then, a portion of the insulation layer is removed to expose the spacers on the sidewalls of the gate electrode. Subsequently, the spacers are removed, and then an ion implantation operation is conducted to implant dopants into the substrate through the windows formed by the uprooted spacers. Ultimately, doped regions of the local pocket type are formed in the substrate under the lightly doped drain source/drain terminals of a MOS transistor.

14 Claims, 7 Drawing Sheets

METHOD FOR MANUFACTURING MOS TRANSISTOR

CROSS-REFERENCE TO RELATED APPLICATION

This application claims the priority benefit of Taiwan application Ser. No. 87120716, filed Dec. 14, 1998, the full disclosure of which is incorporated herein by reference.

BACKGROUND OF THE INVENTION

1. Field of Invention

The present invention relates to a method for manufacturing metal-oxide-semiconductor (MOS) transistor. More particularly, the present invention relates to a MOS transistor having a local pocket structure that can be used for fabricating embedded memory.

2. Description of Related Art

Logic circuit devices and memory devices are normally formed on separate silicon chips. However, as a faster operating speed is demanded, the newer generation of integrated circuit chips is likely to have a mixture of these two types of devices in a single chip. For example, embedded dynamic random access memory (DRAM) has a chip layout that includes a mixture of logic circuit devices and memory devices.

Nevertheless, logic circuit devices and memory devices have different functional properties that require different processing operations. Logic circuit devices are mainly used for logic computation, and therefore should have a very high data-transmission rate. Hence, the source/drain regions of a logic device must have a high concentration of dopants. In addition, the source/drain regions must have a low sheet resistance. Consequently, a layer of metal silicide is generally deposited over the upper surface of a source/drain terminal. In contrast, memory devices are used mainly for data storage. Because a correct data bit can be registered within a memory unit for a defined period only if leakage current is small, a lightly doped source/drain terminal is usually required. Hence, a metal silicide layer is rarely formed over the source/drain terminal of a memory transistor.

As the line width of a device continues to shrink, a short channel effect becomes a critical factor affecting the operational characteristics of the device. To prevent further deterioration of the device, the diffusion of dopants between the source/drain terminals of a MOS transistor in the logic circuit area must be prevented. The conventional method of preventing dopant diffusion includes doping the substrate surrounding the source/drain terminal with dopants having a polarity opposite to the dopants in the source/drain terminal itself. In other words, doped pocket structures are formed around the source/drain terminals. However, forming a doped pocket structure around the source/drain terminal leads to some other problems. For example, the source/drain region and the pocket structure together produce a rather large PN junction capacitance. Furthermore, a portion of the doped pocket structure may overlap with the inversion region. Hence, more intense short-channel inversion effects result, leading to a reduction of device current and a lowering of device efficiency.

In light of the foregoing, there is a need to provide an improved method for manufacturing a MOS transistor.

SUMMARY OF THE INVENTION

Accordingly, the purpose of the present invention is to provide a method for manufacturing a MOS transistor capable of reducing the coupling area of a PN junction capacitor.

In another aspect, the purpose of the invention is to provide a method for manufacturing a MOS transistor on a substrate, which method is capable of preventing the overlapping of its doped pocket structure with its inversion region.

To achieve these and other advantages and in accordance with the purpose of the invention, as embodied and broadly described herein, the invention provides a method for forming a local pocket structure within a MOS transistor. The method includes the steps of providing a substrate having device isolation structures thereon, and then forming a gate oxide layer over the substrate. Next, a gate electrode and a cap layer are sequentially formed over the gate oxide layer. Thereafter, a conformal first insulation layer and a conformal second insulation layer are formed in sequence over the gate oxide layer, the gate electrode and the cap layer. In the subsequent step, using the cap layer and the device isolation region as a mask, first doped regions of the first polarity type are formed in the substrate on each side of the gate electrode. After that, first spacers are formed over the second insulation layer next to the first insulation layer that borders upon the sidewalls of the gate electrode and the cap layer. Thereafter, a mask layer is formed over the memory cell region. Then, using the first spacers, the cap layer and the device isolation regions in the logic circuit region as a mask, a second doped region of the first polarity type is formed in the substrate. Next, the mask layer is removed, and then a planarized third insulation layer is formed over the second doped region of the substrate. Subsequently, a portion of the third insulation layer and a portion of the second insulation layer in the logic circuit region are removed to expose a portion of the first spacers. After that, the first spacers in the logic circuit region, a portion of the first insulation layer and the cap layers are removed, and then another doping operation is carried out. Hence, a third doped region of the second polarity is formed in the substrate in a location just under the first doped region.

According to one preferred embodiment of this invention, each source/drain region in the memory region is a first doped region. On the other hand, each source/drain regions in the logic circuit region is a composite region comprising a first doped region and a second doped region. Furthermore, the third doped region in this invention has a pocket-type structure. Since the third doped region is located in the substrate under the first doped region, the amount of coupling produced by the PN junction capacitor is small. In addition, the pocket type third doped regions are formed below the surface channel region. Thus, when an operating voltage is applied to the gate terminal, a very strong inversion in the surface channel is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1H are schematic, cross-sectional views showing the progression of manufacturing steps in fabricating MOS transistors over a semiconductor substrate according to one preferred embodiment of this invention.

Figure 1A:
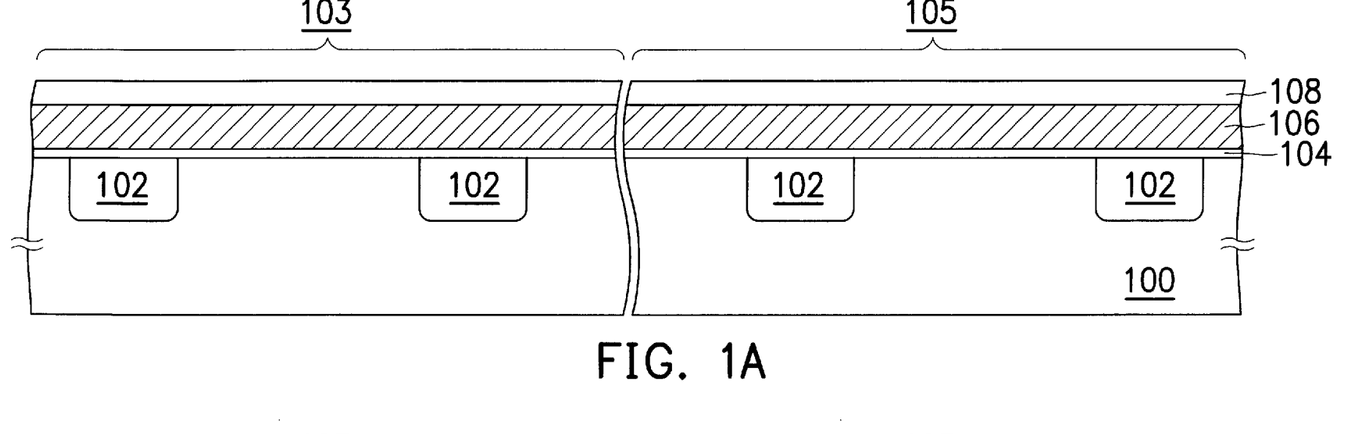
FIGS. 1A through 1H are schematic, cross-sectional views showing the progression of manufacturing steps in fabricating MOS transistors over a semiconductor substrate according to one preferred embodiment of this invention.

As shown in FIG. 1A, a substrate 100 such as a silicon substrate is provided. Then, device isolation structures 102 such as field oxide layers, shallow trench isolation (STI), or other similar structural designs are formed in the substrate 100. Here, STI structures are chosen for isolating devices. The substrate 100 is divided into different areas including a logic circuit area 103 and a memory cell area 105. Thereafter, a gate oxide layer 104, a polysilicon layer 106 and a mask layer 108 are sequentially formed over the substrate 100. The gate oxide layer 104 is formed by performing thermal oxidation. The polysilicon layer 106 having a thickness of between 2000 Å to 3000 Å is formed by performing a chemical vapor deposition (CVD) operation. The mask layer 108 having a thickness of between 1000 Å to 2000 Å can be a silicon nitride ($SiN_x$) layer formed by performing a CVD operation.

Figure 1B:
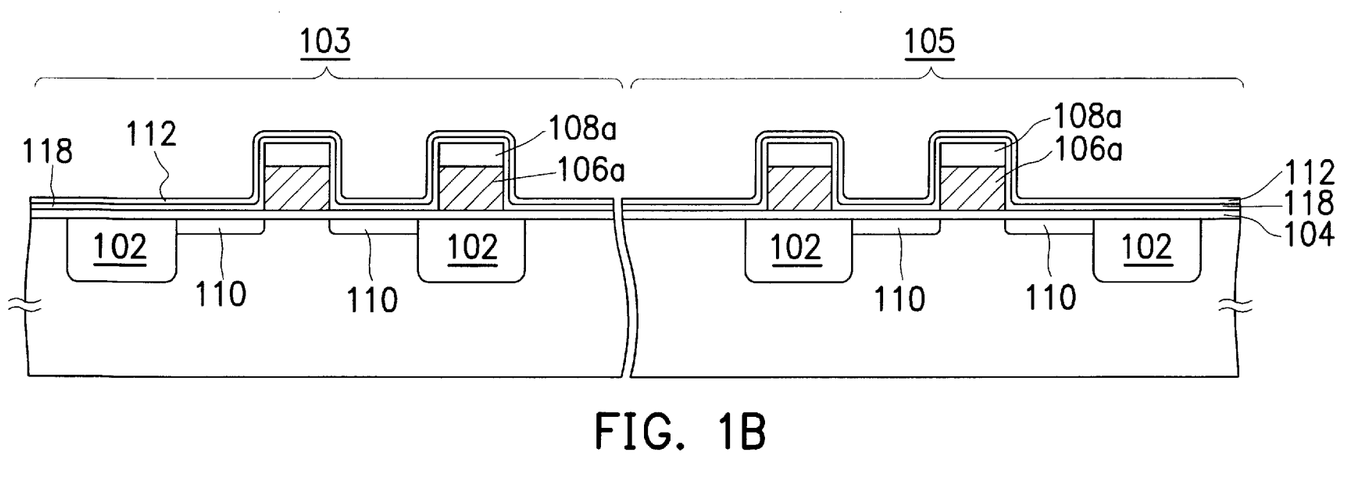

The polysilicon layer 106 and the mask layer 108 are patterned to form gate electrodes 106a and cap layers 108a as shown in FIG. 1B. Thereafter, a conformal first insulation layer 118 and a conformal second insulation layer 112 are sequentially formed over the entire substrate 100. The first insulation layer 118 having a thickness of about 100 Å is formed from a material that differs from the second insulation layer 112 above and the gate oxide layer 104 below. The first insulation layer is preferably a silicon nitride layer. The second insulation layer 112 having a thickness also of about 100 Å is preferably a silicon oxide layer. In the subsequent step, the cap layers 108a and the STI structures 102 are used as a mask to perform a first ion implantation. Therefore, doped regions 110 having a first dopant concentration are formed in the substrate 100 on each side of a gate electrode 108a. The kind of dopants implanted into the substrate of a MOS transistor depends on the electrical properties demanded. For example, for an N-type MOS transistor, N-type dopants are implanted, whereas for a P-type MOS transistor, P-type dopants are implanted.

Figure 1C:
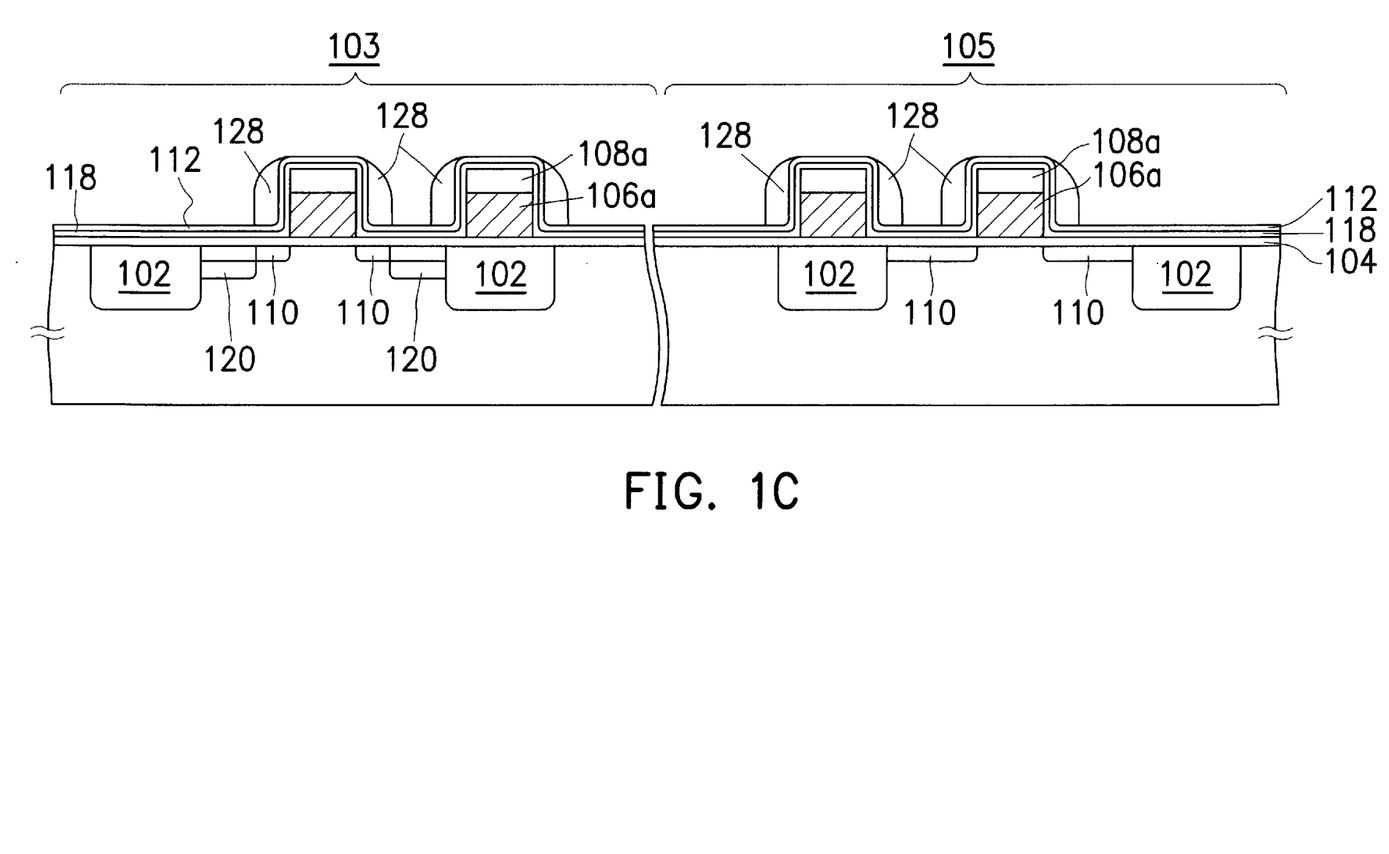

As shown in FIG. 1C, spacers 128 are formed over the second insulation layer 112 next to the first insulation layer 118 that borders upon the sidewalls of the cap layer 108a and the gate electrode 106a. The spacers 128 are formed from a material that differs from the second insulation layer 112, and is preferably silicon nitride. The spacers 128 are formed, for example, by first carrying out a CVD operation to deposit a layer of silicon nitride over the entire substrate 100 and then anisotropically etching back the silicon nitride layer.

Figure 1D:
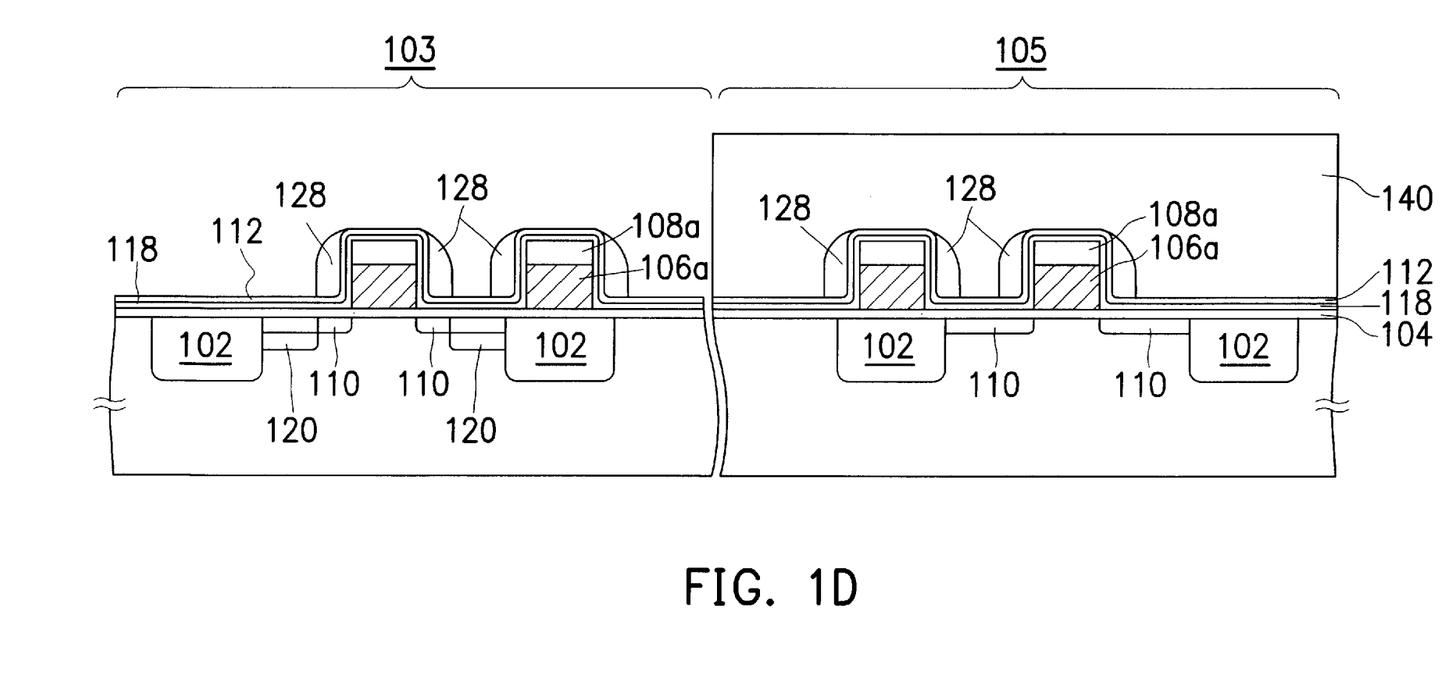

As shown in FIG. 1D, a second mask layer 140 is formed over the substrate 100 in the memory cell area 105. Then, the spacers 128, the cap layers 108a and the STI structures 102 in the logic circuit region 103 are used as a mask to carry out a second ion implantation. Hence, second doped regions 120 having a second dopant concentration are formed in the substrate on each side of the gate electrode 108a.

The same type of dopants is implanted into both the first doped regions 110 and the second doped regions 120. However, the amount of dopants implanted into the substrate to form the second doped regions 120 is higher than the amount used to form the first doped regions 110. In other words, the second dopant concentration is higher than the first dopant concentration. The first doped regions 110 and the second doped 120 regions within the logic circuit area 103 together form a source/drain terminal having a lightly doped drain (LDD) structure. Furthermore, in order to prevent any current from leaking out of the memory device in the memory cell area 105, all the MOS transistors in the memory cell area 105 have lightly doped source/drain terminals 110, only.

Figure 1E:
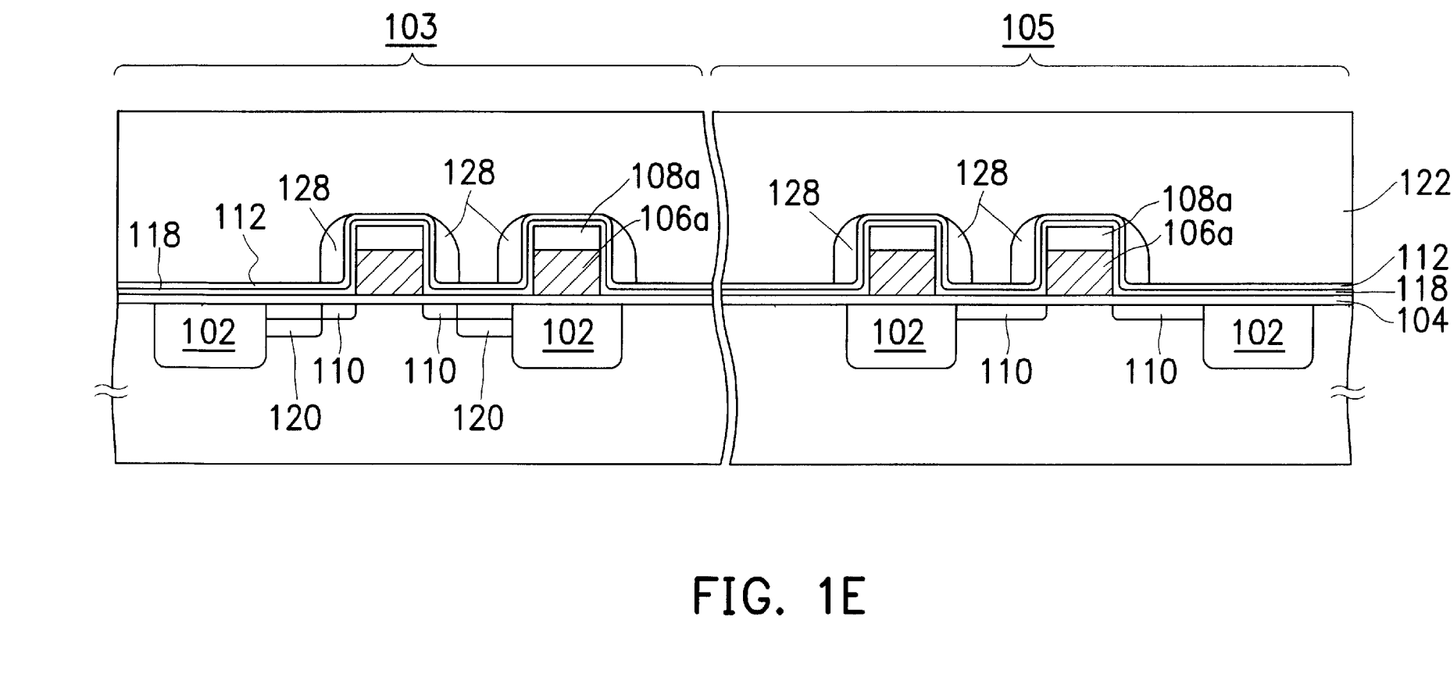

As shown in FIG. 1E, the second mask layer 140 is removed. Then, another insulation layer 122 is formed over the entire substrate 100. Thereafter, a planarization operation is carried out using, for example, a chemical-mechanical polishing (CMP) method. The insulation layer 122 is formed from a material that differs from the spacers 128, and is preferably silicon oxide.

Figure 1F:
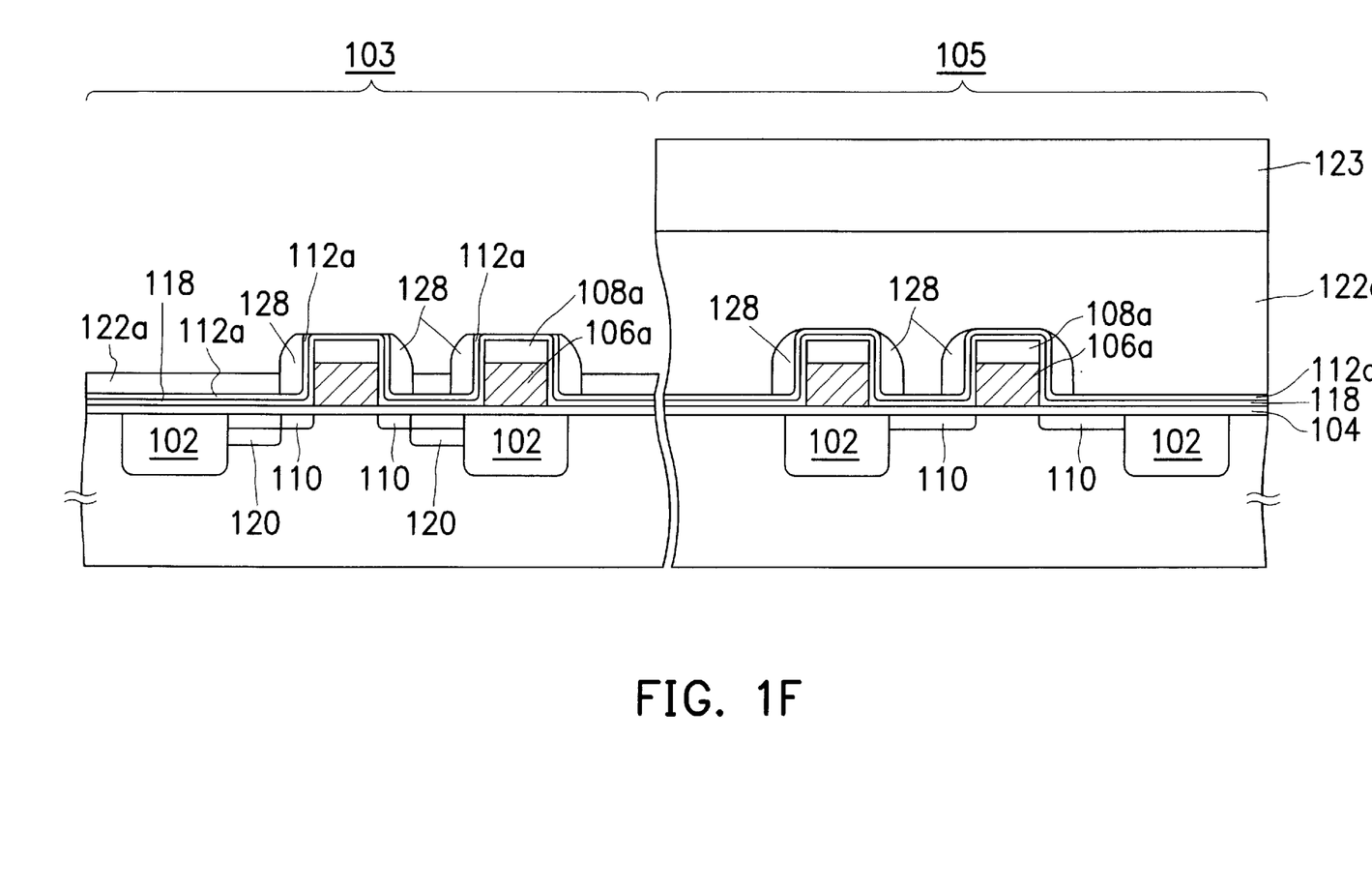

As shown in FIG. 1F, a photoresist layer 123 is formed over the insulation layer 122 in the memory cell region 105. Thereafter, using the photoresist layer 123 as a mask, a portion of the insulation layer 122 in the logic circuit area 102 is removed to form an insulation layer 122a. For example, a portion of the insulation layer 122 can be removed by performing an etching back operation. By removing a portion of the insulation layer 122, a portion of the spacers 128 is exposed so that their subsequent removal is facilitated. In the meantime, a portion of the second insulation layer 112 above the cap layer 108a is also removed, forming an insulation layer 112a.

Figure 1G:
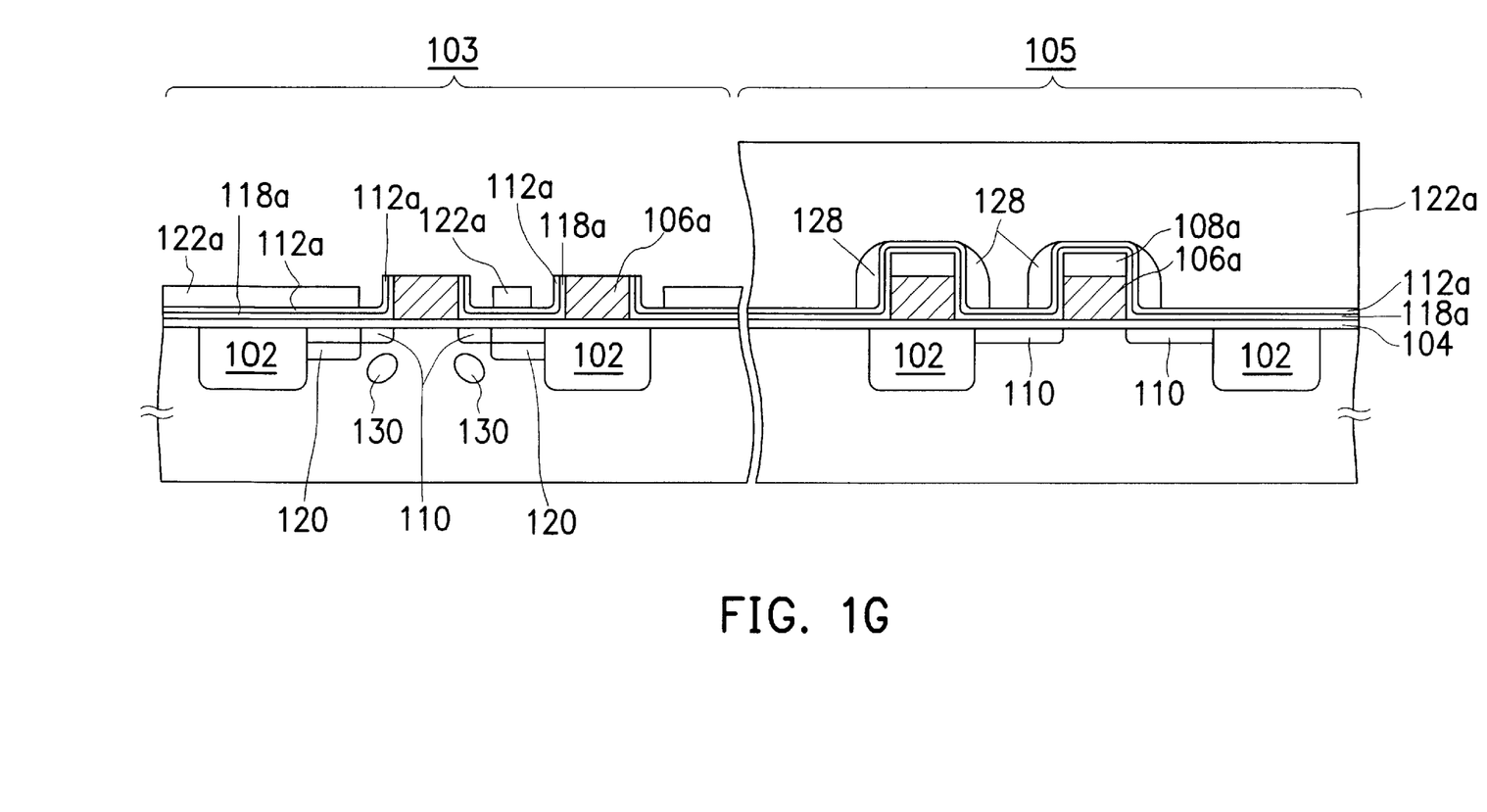

As shown in FIG. 1G, the photoresist layer 123 is removed. Thereafter, using the second insulation layer 112 as an etching stop layer, spacers 128 in the logic circuit area 103 are removed selectively. At the same time, the cap layer 108a above the gate electrode 106a and a portion of the first insulation layer 118 are also removed to form an insulation layer 118a. Subsequently, using the insulation layers 122a, the gate electrodes 106a and the STI structures 102 as a mask, a local pocket-type of implantation is carried out to form a third doped region 130. In the pocket implantation, dopants having a third dopant concentration are implanted into the substrate 100 below the first doped region 110 using an opening that results from uprooting the first spacers 128 as a guide. Dopants in the third doped region 130 are of the polarity type opposite to that of the dopants in the first doped region 110. Moreover, dosage level of the pocket implantation is roughly between $10^{17}$ to $10^{20}$ atoms/cm$^2$.

One major aspect of this invention is that the doped pocket region 130 is formed at a location under the first doped region 110 (the LDD structure) defined by sidewalls of the opening created from an uprooted spacer 128. Hence, coupling of the PN capacitor is limited only to the junction between the first doped region and the third doped region 130, and junction capacitance is small. In addition, the third doped region 130 is kept away from the surface channel region between the source terminal and the drain terminal. Hence, when a gate voltage is applied to form a strong inversion layer in the surface channel region, expansion of the strong inversion layer is prevented. This is because the strong inversion layer does not overlap with the pocket type third doped region 130.

Figure 1H:
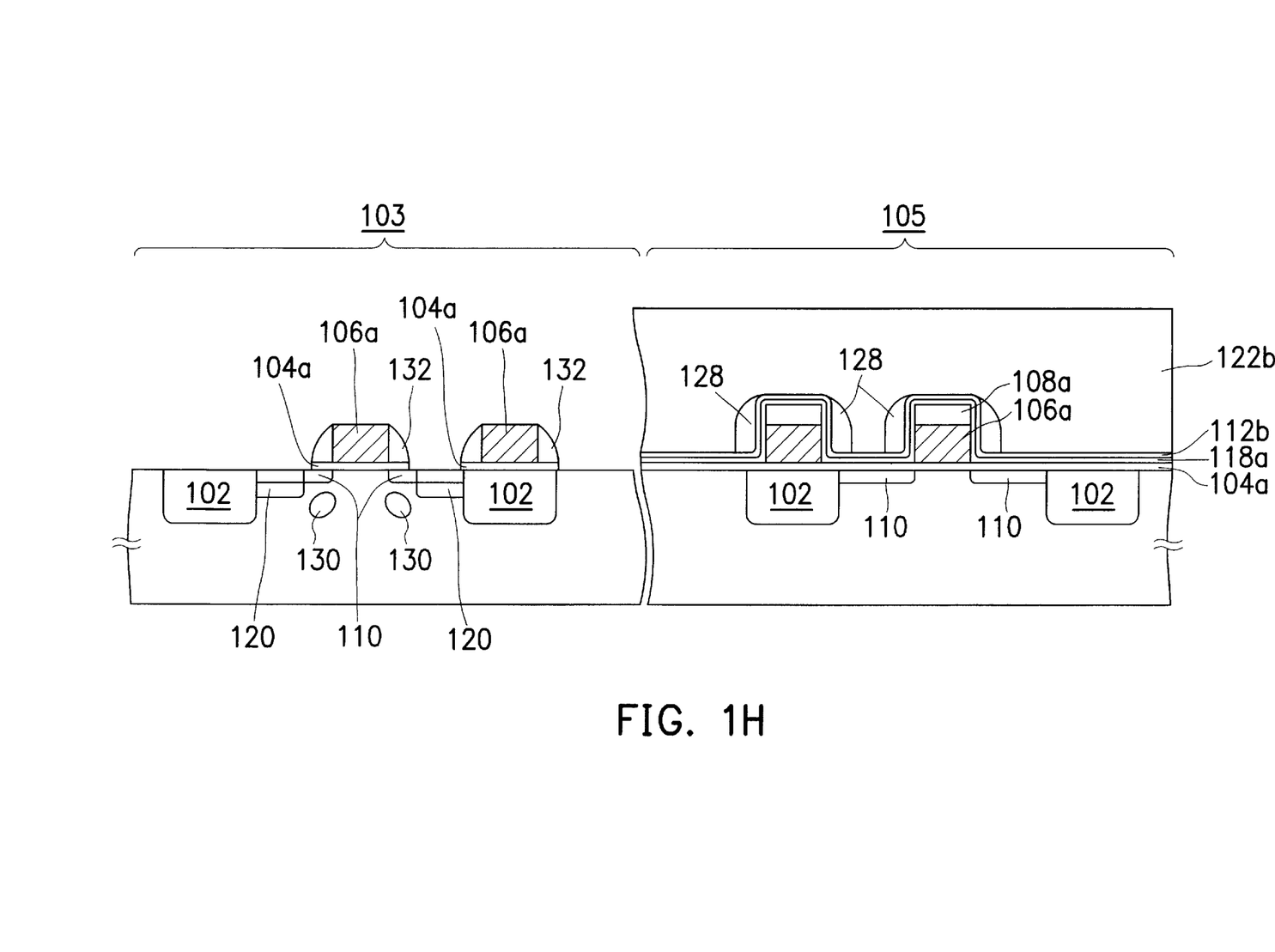

As shown in FIG. 1H, the insulation layer 122a and the insulation layer 112a inside the logic circuit region 103 are removed so that insulation layers 122b and 112b remain over the substrate inside the memory cell region 105. Thereafter, the insulation layer 118a inside the logic circuit area 103 is removed to expose the gate oxide layer 104. After that, spacers 132 are formed on the sidewalls of the gate electrode 106a inside the logic circuit area 103. The spacers 132 can be made by depositing a layer of silicon oxide over the entire substrate 100 and then anisotropically etching back the silicon oxide layer. At the same time, the gate oxide layer 104 will be transformed into a gate oxide layer 104a as shown in the figure.

Alternatively, the insulation layer 118a (not shown in the figure) can be retained so that spacers are formed directly on the insulation layer 118a bordering upon the sidewalls of the gate electrode 106a. If the insulation layer 118a is retained, the invention can be applied to the production of borderless contact as well.

In the subsequent step, a self-aligned silicide processing operation is carried out to form a silicide layer over the source/drain terminals inside the logic circuit region 103. Since the operation is familiar to those people skilled in semiconductor manufacturing techniques, detailed description is omitted here.

In summary, major aspects of the invention include:

1. A pocket type of doped region is formed under the LDD structure of a MOS transistor in the logic circuit area.

2. Since the doped pocket region is restricted to the location under the LDD structure, PN junction capacitance produced by this invention is smaller than the capacitance produced by a conventional method.

3. The doped pocket region is kept away from the surface channel between a source terminal and a drain terminal. Hence, when a voltage is applied to the gate electrode to form a strong inversion layer, the strong inversion layer does not overlap with the doped pocket region. Therefore, a large inversion short channel effect is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a metal-oxide-semiconductor (MOS) transistor, comprising the steps of:

providing a substrate having a device isolation structure thereon;

forming a gate oxide layer over the substrate;

forming a gate electrode and a cap layer over the gate oxide layer;

forming a conformal first insulation layer and a conformal second insulation layer over the gate oxide layer, the gate electrode and the cap layer;

forming a first doped region of a first polarity type in the substrate on each side of the gate electrode using the cap layer and the device isolation structure as a mask;

forming first spacers on the second insulation layer next to the first insulation layer that borders upon the sidewalls of the gate electrode and the cap layer;

forming a second doped region of the first polarity type in the substrate using the first spacers, the cap layer and the device isolation structure as a mask;

forming a planarized third insulation layer over the substrate that also covers the first spacers;

removing a portion of the third insulation layer and a portion of the second insulation layer to expose a portion of the first spacers;

removing the first spacers, a portion of the first insulation layer and the cap layer; and implanting ions into substrate regions under the first doped regions defined by the sidewalls of an uprooted first spacer to form a third doped region of a second polarity type;

wherein the first insulation layer, the first spacers and the cap layer are made from a material that includes silicon nitride, while the second insulation layer and the third insulation layer are made from a material that includes silicon oxide.

2. The method of claim 1, wherein the method further includes the steps of:

removing the third insulation layer and the second insulation layer to expose the first insulation layer; and forming second spacers on the first insulation layer that borders upon the sidewalls of the gate electrode.

3. The method of claim 1, wherein the method further includes the steps of:

removing the third insulation layer, the second insulation layer and the first insulation layer; and forming second spacers on the sidewalls of the gate electrode.

4. The method of claim 1, wherein the first insulation layer, the first spacers and the cap layer are made from one type of material while the second insulation layer and the third insulation layer are made from another type of material.

5. The method of claim 2, wherein the first insulation layer, the first spacers and the cap layer are made from a material that includes silicon nitride while the second insulation layer and the third insulation layer are made from a material that includes silicon oxide.

6. The method of claim 3, wherein the first insulation layer, the first spacers and the cap layer are made from a material that includes silicon nitride while the second insulation layer and the third insulation layer are made from a material that includes silicon oxide.

7. The method of claim 2, wherein the first polarity type includes an N-type while the second polarity type includes a P-type.

8. The method of claim 3, wherein the first polarity type includes an N-type while the second polarity type includes a P-type.

9. The method of claim 2, wherein the first polarity type includes a P-type while the second polarity type includes an N-type.

10. The method of claim 3, wherein the first polarity type includes a P-type while the second polarity type includes an N-type.

11. A method for manufacturing a metal-oxide-semiconductor (MOS) transistor on a substrate divided into a logic circuit area and a memory cell area such that a device isolation structure is formed therein, comprising the steps of:

forming a gate oxide layer over the substrate;

forming a gate electrode and a cap layer over the gate oxide layer;

forming a conformal first insulation layer and a conformal second insulation layer over the gate oxide layer, the gate electrode and the cap layer;

forming a first doped region of a first polarity type in the substrate on each side of the gate electrode using the cap layer and the device isolation structure as a mask;

forming first spacers on the second insulation layer next to the first insulation layer that borders on the sidewalls of the gate electrode and the cap layer;

forming a mask layer over the memory cell area, and then forming a second doped region of the first polarity type in the substrate within the logic circuit area using the first spacers, the cap layer and the device isolation structure as a mask;

removing the mask layer over the memory cell area;

forming a planarized third insulation layer over the substrate;

removing a portion of the third insulation layer and a portion of the second insulation layer in the logic circuit area to expose a portion of the first spacers;

removing the first spacers, a portion of the first insulation layer and the cap layer in the logic circuit area; and implanting ions into the substrate inside the logic circuit area under the first doped regions defined by the sidewalls of an uprooted first spacer to form a third doped region of a second polarity type;

wherein the first insulation layer, the first spacers and the cap layer are made from a material that includes silicon nitride, while the second insulation layer and the third insulation layer are made from a material that includes silicon oxide.

12. The method of claim 11, wherein the method further includes the steps of:

removing the third insulation layer and the second insulation layer to expose the first insulation layer; and forming second spacers on the first insulation layer that borders upon the sidewalls of the gate electrode.

13. The method of claim 11, wherein the method further includes the steps of:

removing the third insulation layer, the second insulation layer and the first insulation layer; and forming second spacers on the sidewalls of the gate electrode.

14. The method of claim 11, wherein the first insulation layer, the first spacers and the cap layer are made from one type of material while the second insulation layer and the third insulation layer are made from another type of material.

* * * * *